United States Patent [19]

Harada

[11] Patent Number: 5,111,416

[45] Date of Patent: May 5, 1992

[54] PSEUDO RANDOM NOISE CODE GENERATOR FOR SELECTIVELY GENERATING A CODE OR ITS MIRROR IMAGE FROM COMMON DATA

[75] Inventor: Masaaki Harada, Tokyo, Japan

[73] Assignee: Clarion Co., Ltd., Tokyo, Japan

[21] Appl. No.: 479,931

[22] Filed: Feb. 14, 1990

[30] Foreign Application Priority Data

Feb. 20, 1989 [JP] Japan .................. 1-38464
Feb. 20, 1989 [JP] Japan .................. 1-38465
Feb. 20, 1989 [JP] Japan .................. 1-38466

[51] Int. Cl.⁵ ............................... G06F 1/02
[52] U.S. Cl. ................................... 364/717
[58] Field of Search ........................ 364/717

[56] References Cited

U.S. PATENT DOCUMENTS

| | | | |
|---|---|---|---|
| 4,225,935 | 9/1980 | Zscheile, Jr. et al. | 364/717 |
| 4,341,925 | 7/1982 | Doland | 364/717 |
| 4,776,012 | 10/1988 | Zscheile, Jr. et al. | 364/717 |
| 4,845,654 | 7/1989 | Harada et al. | 364/717 |
| 4,847,861 | 7/1989 | Hamatsu et al. | 375/1 |
| 4,852,023 | 7/1989 | Ree et al. | 364/717 |
| 4,862,479 | 8/1989 | Hamatsu et al. | 375/1 |
| 4,864,525 | 9/1989 | Kurihara et al. | 364/717 |
| 4,912,666 | 3/1990 | Harada | 364/717 |
| 4,945,537 | 7/1990 | Harada | 364/717 |

FOREIGN PATENT DOCUMENTS

| | | | |
|---|---|---|---|
| 0050512 | 2/1980 | Japan | 364/717 |
| 63-95744 | 4/1988 | Japan . | |
| 63-200825 | 6/1988 | Japan . | |
| 0250210 | 10/1988 | Japan | 364/717 |
| 63-255396 | 10/1988 | Japan . | |

OTHER PUBLICATIONS

Hamatsu et al., National Meeting of the Electric Communication Society 48 (1986), 1 page.

Primary Examiner—Dale M. Shaw
Attorney, Agent, or Firm—Flynn, Thiel, Boutell & Tanis

[57] ABSTRACT

A pseudo random noise code generator has two code data generators which respectively supply first and second code data through respective first and second bit inverting circuits to respective input ports of a multi-stage shift register having an output. Each bit inverting circuit is responsive to the state of a control signal for producing at its output either the code data at its inputs or an inverted version of the code data at its inputs. In a modified version, first and second code data generators each respectively supply first and second code data to respective input ports of a multi-stage first shift register, and a third code data generator supplies third code data to an input port of a multi-stage second shift register having a further input port to which is supplied constant code data, and a modulo 2 adder is provided to add the outputs of the first and second shift registers. A modified version of this latter arrangement includes a third shaft register having two input ports to which are respectively supplied the first and second code data, and a further modulo 2 adder is provided to add the outputs of the second and third shift registers.

11 Claims, 10 Drawing Sheets

PSEUDO RANDOM NOISE CODE GENERATOR FOR SELECTIVELY GENERATING A CODE OR ITS MIRROR IMAGE FROM COMMON DATA

FIELD OF THE INVENTION

The present invention relates to a pseudo random noise code generator used in an application field, where a code division multiplex signal is required, such as the spread spectrum communication (hereinbelow abbreviated to SSC), etc.

BACKGROUND OF THE INVENTION

In an application field, where a code division multiplex signal is required, such as the SSC, etc. it is required for a pseudo random noise code generator (hereinbelow called simply code generator) to be able to change its output code pattern. Heretofore a circuit structure as indicated in FIG. 6 has been utilized for the code generator capable of generating an arbitrary m sequence code according to an external control on the code period, the code pattern and the code phase.

In FIG. 6, $SR_1$ to $SR_{n-1}$ and $SR_f$ are flipflops and $E_2$ to $E_n$ are exclusive logic sum gates, these two sorts of elements constituting a modular type shift register. Further MUX1 is a multiplexer controlling the number of stages of the modular type shift register stated above; $AN_2$ to $AN_n$ are AND gates specifying the presence or absence of the feed back of a signal from the last output to each of the stages of the modular type shift register; and $DS_1$ to $DS_n$ are data select circuits setting an initial value of the modular type shift register described above. That is, data $c_1$ to $c_i$ perform the address assignment of the multiplexer MUX1 and determine the number of stages of the modular type shift register and thus the code period. On the other hand, data $a_2$ to $a_n$ determine the feedback state of the signal from the last stage to each of the stages of the modular type shift register and thus the code pattern. Finally data $b_1$ to $b_n$ determine the initial value of the modular type shift register and thus the code phase. In this way, the code period, the code pattern and the code phase can be controlled independently from each other so that an arbitrary m sequence code can be generated. These three sorts of data necessary for controlling the code are inputted in time sharing through common data lines $DAT1$ to $DAT_n$ for the purpose of reducing the number of input terminals. LAT1, LAT3 and LAT4 are latch circuits for inputting and holding the code pattern data $a_2$ to $a_n$, the code phase data $b_1$ to $b_n$ and the code period data $c_1$ to $c_i$, respectively. DEC1 is a decoder circuit for selecting the latch circuits, in which the data should be written, using 2-bit signals SEL0 and SEL1. Since the output of the decoder circuit becomes active, only when a latch enable signal LE is at the "H" level, it is possible to control the timing of writing the data in the latch circuit by using the latch enable signal. After the setting of the code data, the output of a new code is started by an STB signal. At this time, in order that the code is not switched over during the setting of the code data, the code pattern data and the code period data are held in latch circuits having a double structure by means of LAT2 and LAT5. Further CLK represents a clock signal input terminal and CODE indicates a code output terminal.

Now, in the code division multiplex communication, for the reason of secrecy of signals, prevention of cross-talk and use of multiple channels, a GOLD code, which has a number of patterns much greater than that of the m sequence code having a same code period, is often used. The GOLD code is a code obtained by adding a plurality of m sequence codes having a same period but different patterns mod.2. It is known that $(2^n-1) \cdot (r-1)$ kinds of patterns can be obtained from r m sequence codes. FIG. 7 shows an example of the circuit structure, in the case where the GOLD code is obtained by using a prior art type of code generator. In FIG. 7, PNG1 and PNG2 are code generators having the structure indicated in FIG. 6; E1 is an exclusive logic sum gate for effecting the addition mod.2; and FF1 is a flipflop disposed for removing hazards produced in the exclusive logic sum gate E1 due to a difference in the delay time between the code generators PNG1 and PNG2 to obtain a code output in synchronism with the clock. In general, $(2^n-1)$ GOLD codes can be obtained, starting from 2 m sequence codes having a period of $(2^n-1)$ by varying the mutual phase difference therebetween. By means of the circuit indicated in FIG. 7 a still greater number of GOLD codes can be obtained by varying the pattern of the m sequence codes.

As explained above, the code generator having the structure indicated in FIG. 6 can be utilized in the code division multiplex communication such as the SSC, etc., owing to the fact that an arbitrary number of m sequence codes can be obtained by setting the code data from the exterior. However, it had a drawback that although it can be used for multiple purposes, the three sorts of data should be given from the exterior, every time the code is switched over. In particular, in an SSC using a convolver, etc., as indicated in FIG. 8, since a received signal $P_1$ and a reference signal $P_2$ are inputted through the two extremities of the convolver to obtain the correlation therebetween, the forwarding direction of the code $P_1$ on the transmitter side is opposite to that of the code $P_2$ on the receiver side, it is necessary to use a mirror image code at the transmission and reception. Consequently the prior art code generator had a drawback that different code data should be given for the transmission and the reception.

Further, in the field of the code division multiplex communication such as the SSC, etc., for the reason of secrecy of signals, prevention of cross-talk and use of multiple channels, it is advantageous to use the GOLD code, which has a number of code patterns much greater than that of the m sequence code having a same code period.

Now the structure of a code generator capable of dealing with the code shift keying (hereinbelow abbreviated to CSK) is considered. The CSK is a communication system, by which two kinds of codes are made correspond to information "0" and "1". Consequently, in order that the CSK can be effected, 2 kinds of GOLD codes should be generated simultaneously. As a method, by which a plurality of GOLD codes are generated simultaneously by 2 m sequence code generators, heretofore there was known e.g. that disclosed in Japanese patent application 63-200825, filed Aug. 10, 1988, by the same applicant. It is a method for obtaining GOLD codes having different patterns by using, apart from a code output from an m sequence code generator, a code having a delayed phase obtained by inputting the code output in a flipflop and by being based on a code output from another m sequence code generator together therewith. FIG. 9 shows an example of the structure of a code generator for the CSK using this method.

In FIG. 9, MSRG1 and MSRG2 are modular type shift register circuits, each of which consists of n stages; E1 and E2 are exclusive logic sum gates generating a GOLD code by adding 2 m sequence codes mod.2; FF1, FF2 and FF3 are flipflops for removing hazards produced in the exclusive logic sum gates to obtain a code output in synchronism with a clock signal: PTN1 and PTN2 are memory circuits for holding code pattern data specifying a feedback wiring method for the modular type shift register circuits MSRG1 and MSRG2; and LAT1 is a latch circuit, in which code phase data specifying the initial state of the shift register MSRG2 are inputted from the exterior and held. Further DS1 is a data select circuit, which selects one of the outputs of the gates E1 and E2 to output it to the flipflop FF3; and DS2 is a data select circuit, which gives a flipflop FF4 an initial value, when an output of the code is started by a STB signal. Still further, FF4 is a flipflop for obtaining a code output having a phase delayed by 1 chip with respect to the code output of the shift register MSRG2 through a terminal $SI_n$.

For explaining the operation, the m sequence codes obtained through terminals CO of the shift registers MSRG1 and MSRG2 are represented by u and v, respectively, by the vector representation and a state transition matrix by T. Since the terminal $SI_n$ of each of the shift registers MSRG1 and MSRG2 takes out an input signal to the flipflop in the last stage in the relevant modular type shift register (i.e. flipflop, with the output of which the terminal CO is connected), the codes obtained through the terminals $SI_n$ are Tu and Tv, which have phases advanced by 1 chip with respect to u and v, respectively. Consequently the output of the gate E1 is Tu⊕Tv; the output of the flipflop FF4 is v; and the output of the gate E2 is Tu⊕v. In this way, it can be understood that GOLD codes having different patterns u⊕v and u⊕$T^{-1}$v are obtained at terminals GOLD1 and GOLD2, where the phase is delayed by one chip by one respective flipflop. Further, a code u⊕v or u⊕$T^{-1}$v is outputted through a terminal CSK for the CSK output, depending on the state of a signal CSK1, and thus it can be understood that the CSK is possible.

Now, by this system, since the phase of the code outputted by the shift register MSRG2 can be changed by the external control, the pair of the two codes used for the CSK can be expressed generally by u⊕$T^i$u and u⊕ $T^{j31\ 1}$u, where i is an arbitrary integer. Consequently, in order that the code of one channel does not overlap the code of another in the CSK, a condition expressed e.g. by the following equation should be fulfilled;

$$i = 2m (0 \leq m \leq 2^{n31\ 1} - 1) \quad (1)$$

where m is an integer.

However, since an m sequence code generator consisting of n stages can be considered as a counting circuit, which counts numbers of 1 to $2^{n-1}$ (decimal) at random, it is obvious that it cannot be dealt with only by giving an even number as an initial state. In order to give code phase data satisfying the condition expressed by Equation (1), it is necessary to deduce a state equation from the structure of the code generator and to analyze the initial state.

As described above, it is possible to construct easily a code generator, which can deal with the CSK by applying the system stated above. However, for the application of the system stated above, it is necessary to analyze the set code data. Therefore, it had a drawback that the advantage that the code data of the code generator having the structure indicated in FIG. 10 can be assigned to the channel number; as they are, is lost.

Still further, although the code generator according to the prior art system can deal with the generation of various kinds of codes, when the use thereof in practice is taken into account, it has the following drawbacks;

(1) For every selection of the channel, i.e. for every setting of the code it is necessary to give a plurality of code generators three sorts of code data, i.e. code period, code pattern and code phase.

(2) It is necessary to obtain previously the code data necessary for setting a desired channel, i.e. a desired code by analysis, etc.

Consequently, in some respects, it was very difficult for users, who are not well acquainted with the structure of the code generator and how to use it, to make the best thereof.

SUMMARY OF THE INVENTION

A first object of the present invention is to provide a code generator, in which same code data can be used even for a communication system where codes, which are in a mirror image relation in the transmission and reception, are required.

In order to achieve the first object described above, a code generator according to the present invention is characterized in that it comprises a bit inverting arrangement, in which code data necessary for setting a code u are inputted and which generates mirror image code data for setting the mirror image code $\bar{u}$ of the code u stated above, and a shift register, which outputs a pseudo random noise code on the basis of the mirror image code data described above.

When the code generator according to the present invention is used, a code, which is the mirror image of the code on the transmitter side, is set automatically on the receiver side, starting from same code data by setting a T/$\bar{R}$ signal at the "H" level on the transmitter side and at the "L" level on the receiver side. Further, in the mixer type SSC, etc., where same codes are required in the transmission and reception, if the T/$\bar{R}$ signal in the code generators in the transmitter and receiver is unified to either of the "H" level and the "L" level, the same codes can be set, starting from same data. In either case, by using the code generator according to the present invention, it is possible to use same code data for one communication channel.

A second object of the present invention is to provide a code generator for the CSK, in which code data can be assigned to the channel number, as they are.

In order to achieve the second object described above, a code generator according to the present invention is characterized in that it comprises a first shift register, in which first code pattern data are inputted and whose initial state is fixed; a second shift register, in which second code pattern data, which are different from the first code pattern data, are inputted and the initial state of a predetermined stage thereof is fixed, while the other stages thereof are constructed so as to be variable; a third shift register, in which the second code pattern data described above are inputted and at the same time the initial state of a predetermined stage thereof is fixed, while the other stages thereof are constructed so as to be variable, the third shift register generating a code having a same pattern but a different phase with respect to the second shift register described above; means for adding the outputs of the first and the second shift register to each other mod.2; and an arrangement for adding the outputs of the first and the third shift register to each other mod.2, so as to generate different GOLD codes.

As a code generator for the CSK, since 1 to $2^{n-1}$ successive series of code data can be used, neither microcomputer control nor complicated driver circuit is necessary at setting the codes.

A third object of the present invention is to provide a pseudo random noise code generator, for which no analysis of the code data by a user is necessary and the code can be set in a simple manner.

In order to achieve the third object described above, a code generator according to the present invention is characterized in that it comprises an arrangement for transmitting fixed code pattern data; at least two shift registers, each of which consists of n stages, a data signal corresponding to the transmitted code pattern data being inputted through the code data port; and an arrangement for adding the outputs of the at least two shift registers described above to each other mod.2; wherein the initial state of one of the shift registers is fixed and the other is so constructed that the initial state is variable.

The prior art system indicated in FIG. 6 can deal with the generation of various sorts of codes, because three sorts of code data, i.e. code period, code pattern and code phase, can be controlled independently. However, on the other hand, it had as a drawback that the methods for setting the codes are complicated. Therefore, according to the present invention, the period of the generated codes is fixed and it is intended to simplify the method for setting the codes by restricting the object thereof to GOLD codes.

BRIEF DESCRIPTION OF THE DRAWINGS

FIG. 8 comprising

DETAILED DESCRIPTION

Figure 1:
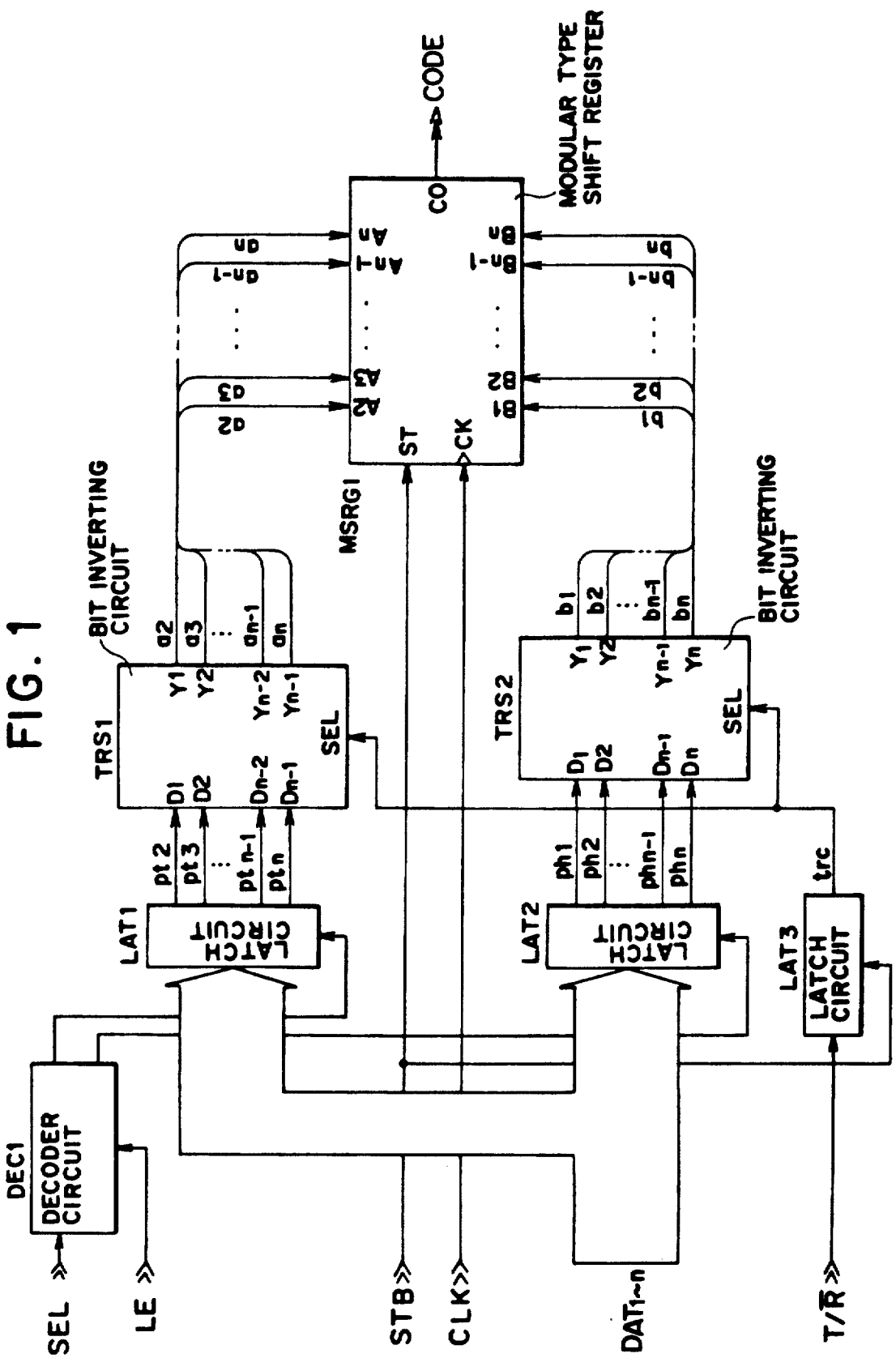
FIG. 1 is a circuit diagram indicating the construction of a first embodiment of the pseudo random noise code generator according to the present invention.

FIG. 1 shows the first embodiment of the code generator according to the present invention, in which LAT1 and LAT2 are latch circuits, which receive code pattern data $pt_2$ to $pt_n$ and code phase data $ph_1$ to $ph_n$ in time sharing from data lines DAT1 to n, respectively, and hold them; TRS1 and TRS2 are bit inverting circuits, each of which outputs the input as it is, when a control signal trc is at the "H" level, and a signal inverted so that the LSB (LEAST SIGNIFICANT BIT) and the MSB (MOST SIGNIFICANT BIT) are replaced by each other, when it is at the "L" level. Further DEC1 is a decoder circuit for controlling the data input to the latch circuit, responding to a latch select signal SEL and a latch enable signal LE and MSRG1 is a modular type shift register circuit having a structure of n stages. Still further LAT3 is a latch circuit disposed in order that the bit inverting operation is performed in synchronism with a STB signal.

Figure 2:
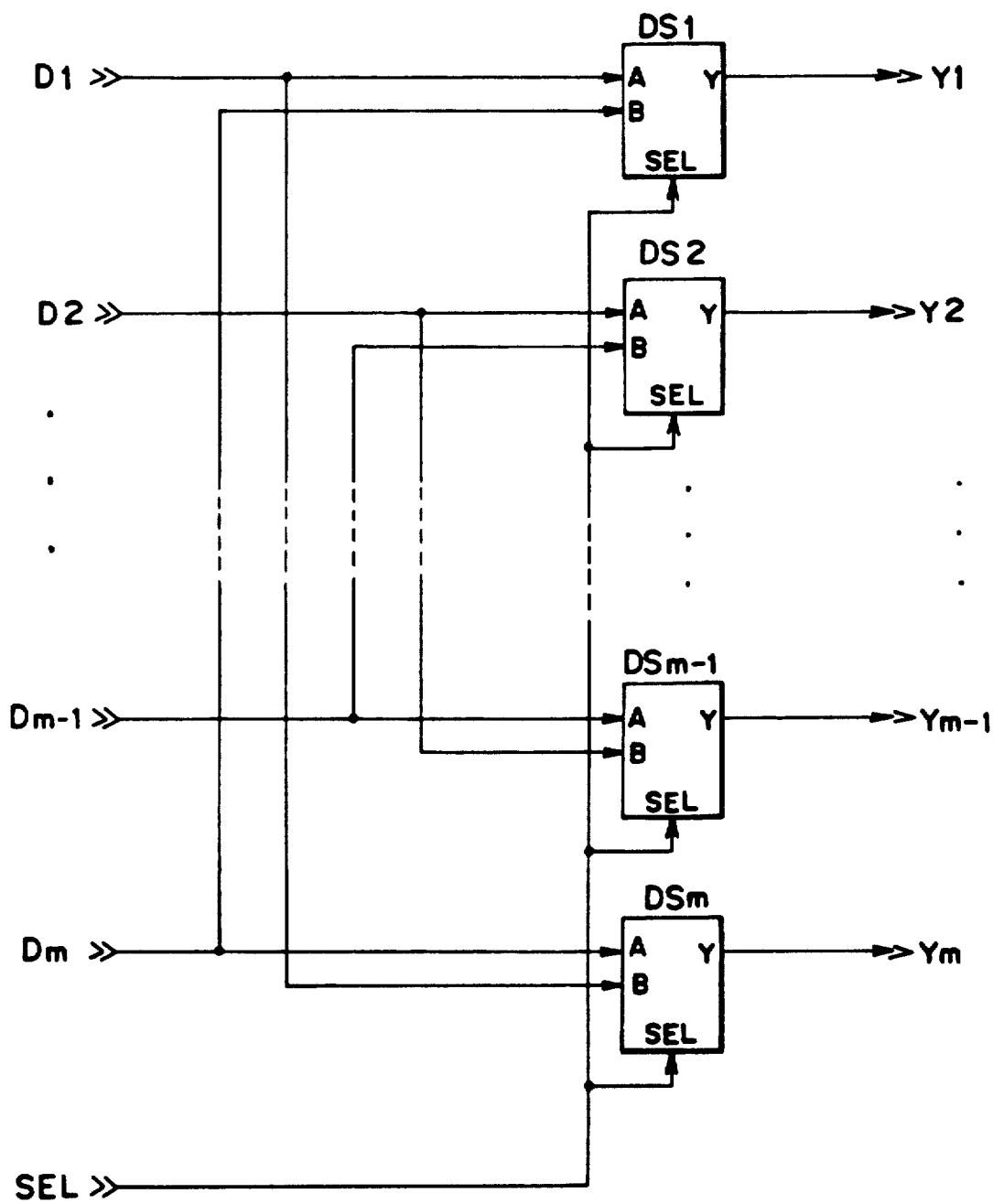
FIGS. 2 and 3 are schemes showing the circuit construction of a bit inverting circuit and a modular type shift register, respectively.
Figure 3:
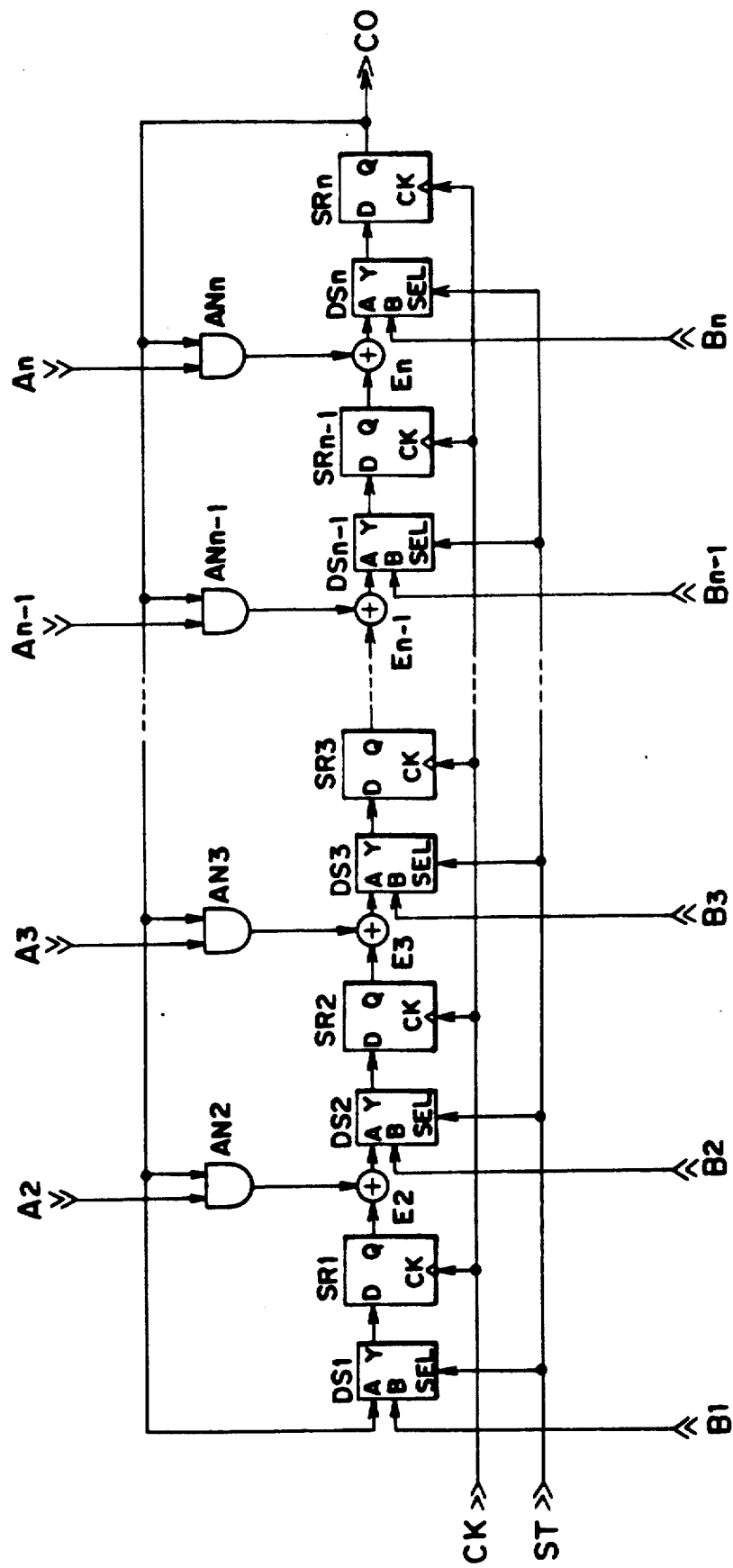

FIGS. 2 and 3 show concrete examples of the bit inverting circuit and the modular type shift register circuit, respectively. In FIG. 2, $DS_1$ to $DS_n$ are data select circuits. In FIG. 3, $AN_2$ to $AN_n$ are AND circuits; SR1 to SRN are flipflops constituting the shift register; and $E_2$ to $E_n$ are exclusive logic sum circuits.

Hereinbelow the operation of the embodiment described above will be explained.

Figure 6:
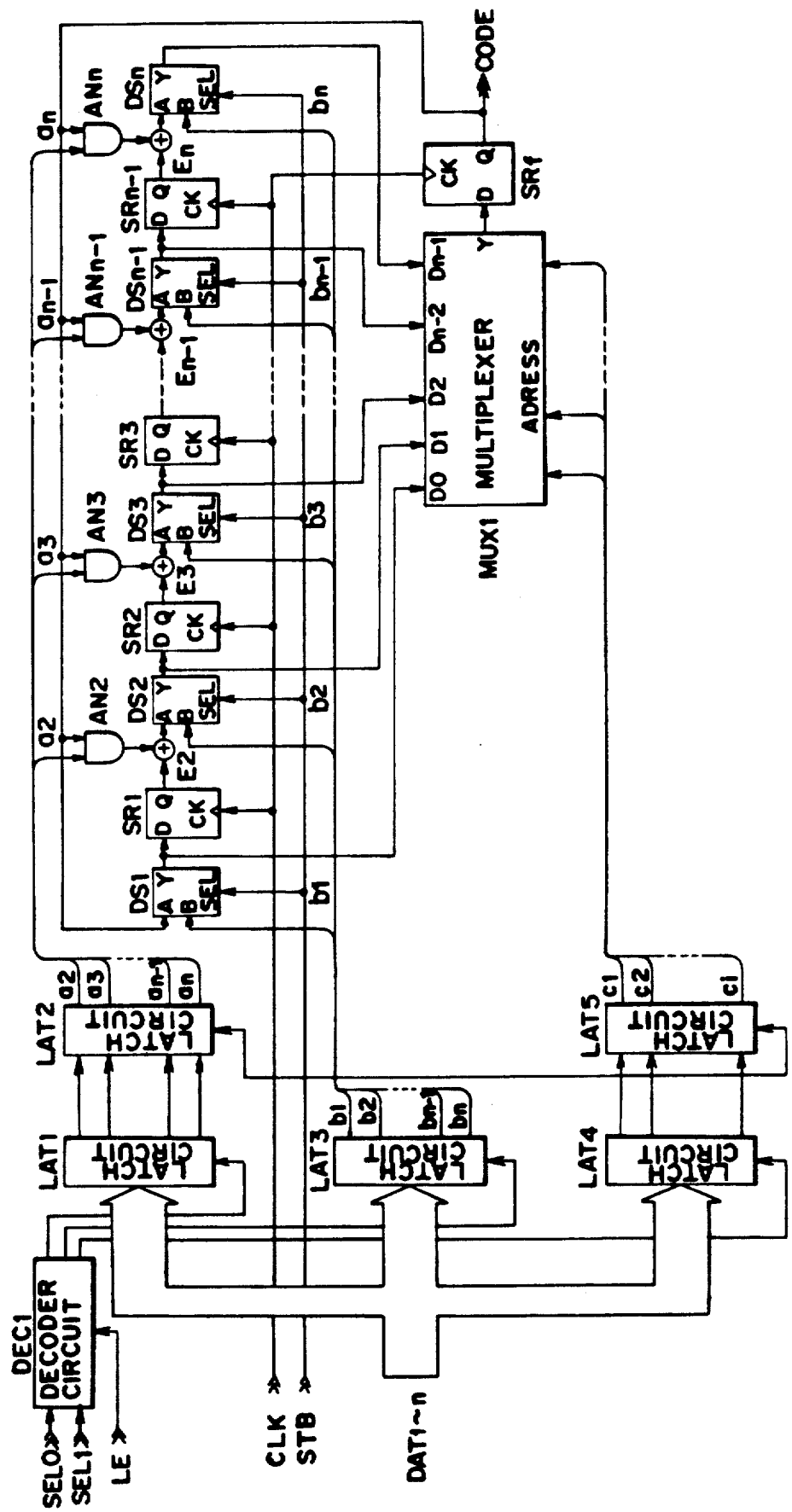
FIG. 6 is a scheme showing the construction of a prior art random noise code generator.
Figure 7:
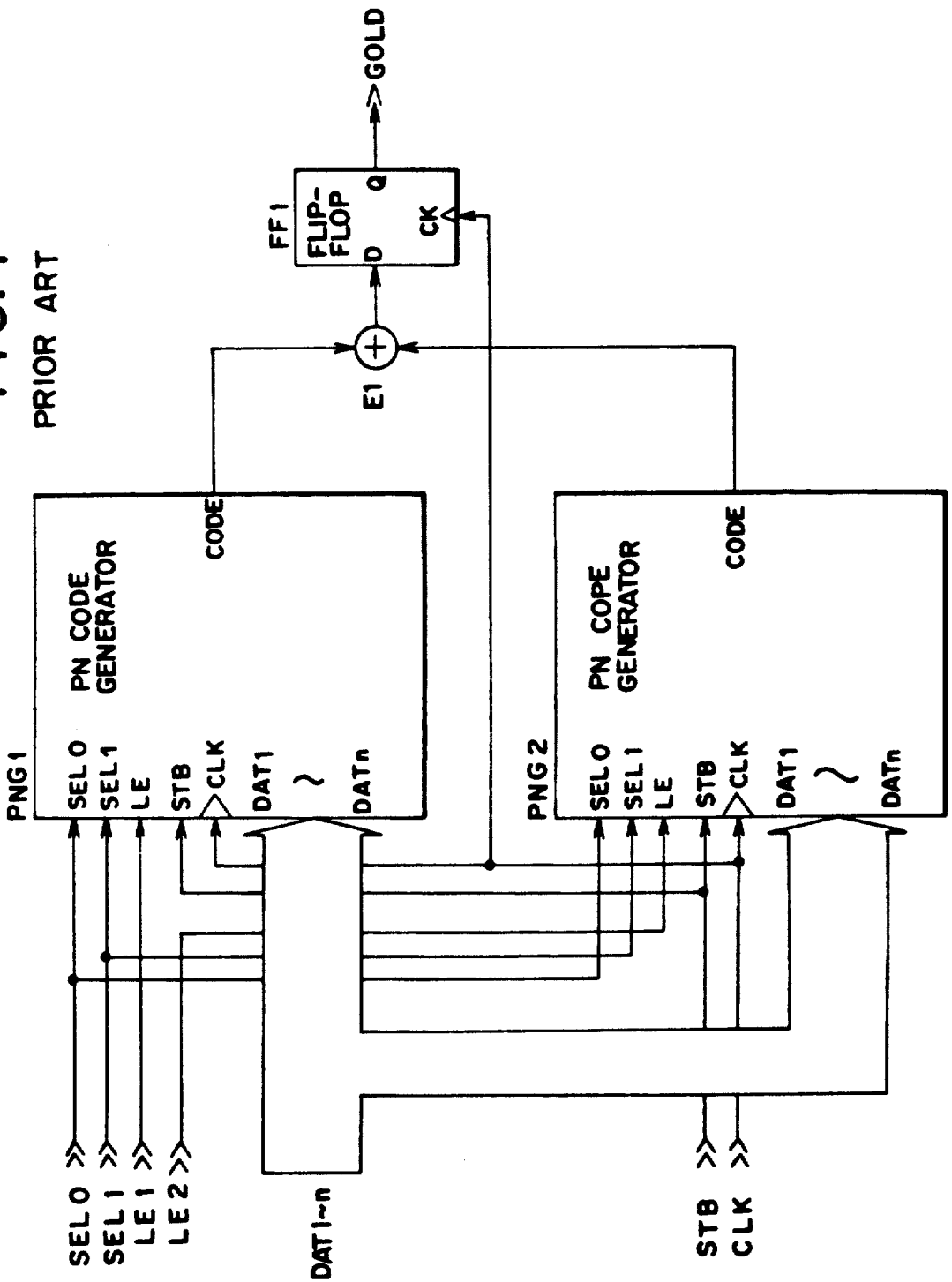
FIG. 7 is a scheme showing the construction of a GOLD code generating circuit using prior art pseudo random noise code generators.
Figure 8A:
FIGS. 8A and 8B, is a scheme indicating the relation between codes used in the transmission and the reception of the convolver type SSC.
Figure 8B:
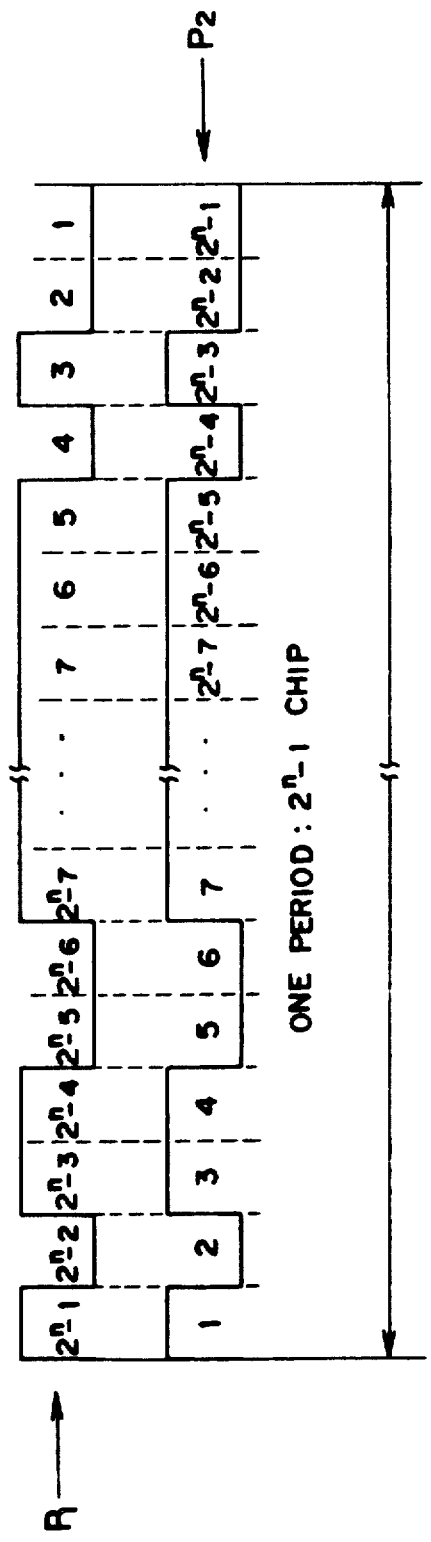
Figure 9:
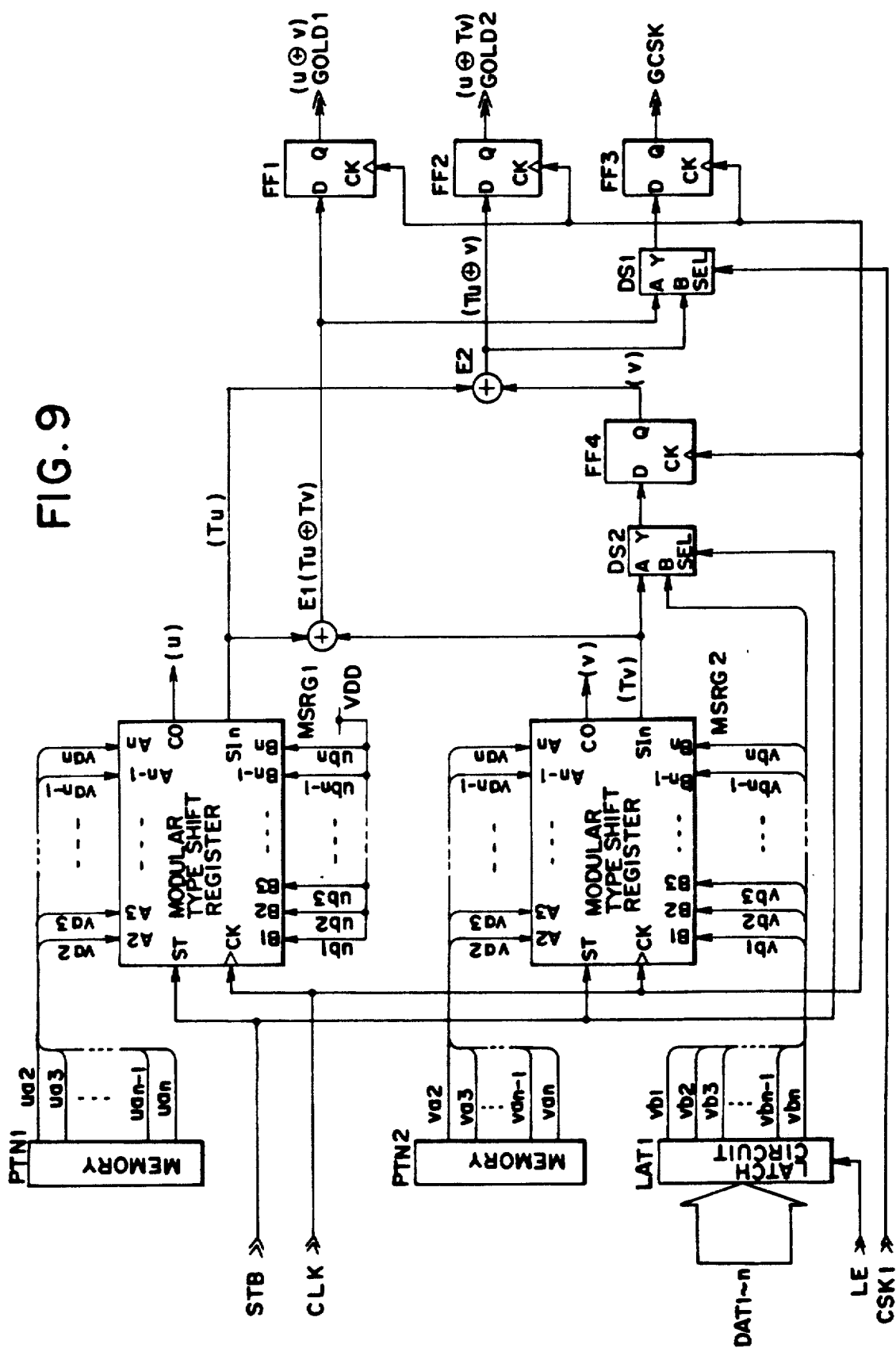
FIG. 9 is a scheme showing the construction of a code generator for the CSK.

In the case where code generators, whose structure is indicated in FIG. 6, are used in the transmission and reception, when mirror image codes are generated in the transmission and the reception, the relation between the two sets of code data will be described. However, in the case where the two codes are in a mirror image relation to each other, since it is clear that the code periods of them are equal to each other, it can be supposed that the number of stages of the two modular type shift registers is n. Further, for the purpose of explanation the code pattern data $a_2$ to $a_n$ are defined by a vector $[a_2 a_3 \ldots a_{n-1} a_n]$ and the code phase data $b_1$ to $b_n$ by $[b_1 b_2 \ldots b_{n-1} b_n]$. Then the code data given in the transmission and the reception can be expressed as follows;

| On the transmission side: | |
|---|---|
| code pattern data: | $[ta_2 ta_3 \ldots ta_{n-1} ta_n]$ |
| code phase data: | $[tb_1 tb_2 \ldots tb_{n-1} tb_n]$ |
| On the reception side: | |
| code pattern data: | $[ra_2 ra_3 \ldots ra_{n-1} ra_n]$ |
| code phase data | $[rb_1 rb_2 \ldots rb_{n-1} rb_n]$ |

As described in the explanation of the prior art system, the code data are data indicating the feedback wiring method and the code phase data are data indicating the initial state of the modular type shift register.

At first, concerning the feedback wiring method for obtaining the mirror image code, according to R. C. Dixon, Spread Spectrum Systems, pp. 86–92, John Wiley & Sons (1984) it is known that a feedback wiring method, [n, n−r, ... n−p]m for [n, r, ... p]m, may be used. Consequently it can be known that the code pattern data on the reception side may be set as Equation (1);

$$[ra_2 ra_3 \ldots ra_{n-1} ra_n] = [ta_n ta_{n-1} \ldots ta_3 ta_2] \quad (1)$$

Next the method for determining the initial state of the modular type shift register for obtaining the mirror image code is disclosed in Hamatsu, et al., National Meeting of the Electric Communication Society 48, (1986) (in Japanese) and JP-A-63-95744. In particular, in the case where the code output is taken out from the last stage of the modular type shift register, according to Japanese patent application No. 63-255396, it is known that the code phase data may be set, as given by Equation (2).

$$[rb_1 rb_2 \ldots rb_{n-1} rb_n] = [tb_n tb_{n-1} \ldots tb_2 tb_1] \quad (2)$$

Consequently, according to Equations (1) and (2), it is known that same code data can be utilized in common in the transmission and the reception by means of a bit inverting circuit, which replaces the LSB and the MSB by each other.

As explained above, according to the first embodiment of the present invention it is possible to obtain two codes, which are in the mirror image relation, starting from same code data, and thus an advantage is obtained in that the same code data can be used in the transmission and the reception in the case where a same code is used in the transmission and the reception, and even in the case where the mirror image code is used.

Figure 4:
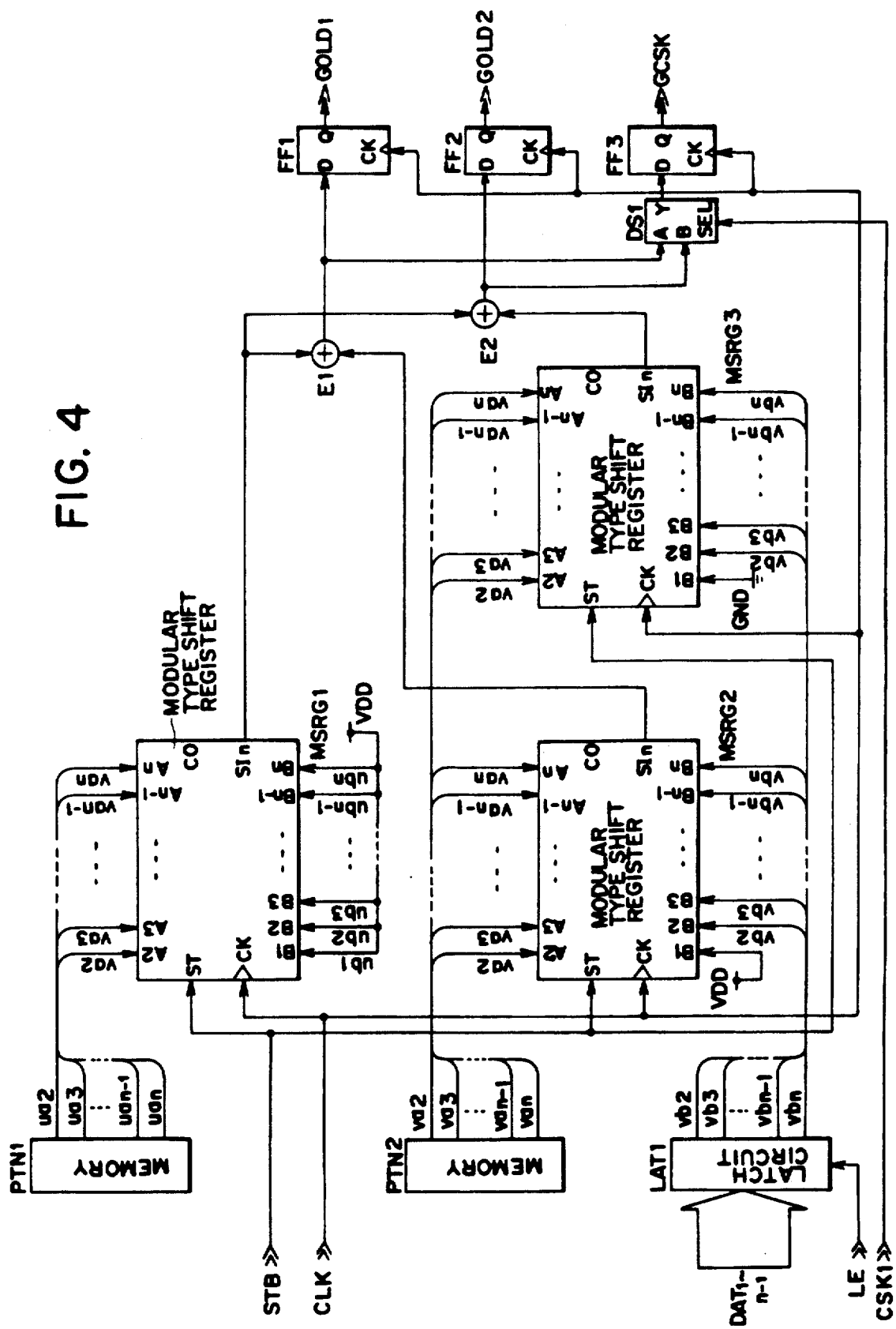
FIGS. 4 and 5 are circuit diagrams indicating the construction of a second and a third embodiment of the pseudo random noise code generator according to the present invention.

FIG. 4 shows a second embodiment of the code generator according to the present invention. In FIG. 4, MSRG1, MSRG2 and MSRG3 are modular type shift register circuits having a structure consisting of n stages, whose concrete example is indicated in FIG. 3; PTN1 and PTN2 are memory circuits holding code pattern data specifying the feedback wiring method for the modular type shift register circuits MSRG1 and MSRG2 as well as MSRG3; and LAT1 is a latch circuit, which receives data of $n-1$ bits in the initial state of n bits for the shift register circuits MSRG2 as well as MSRG3 from the exterior to hold them. Further, E1 and E2 are exclusive logic sum gates for adding the code outputs of the shift register circuits MSRG1 and MSRG2 and the code outputs of the shift registers MSRG1 and MSRG3, respectively, mod.2; FF1, FF2 and FF3 are flipflops disposed for removing hazards produced in the exclusive logic sum gates and for obtaining a code output in synchronism with a clock signal; and DS1 is a data select circuit, which selects either one of the GOLD code generated by the gate E1 and the GOLD code generated by the gate E2, responding to the state of a CSK1 signal given from the exterior and outputs it to the flipflop FF3.

Hereinbelow the operation of the embodiment described above will be explained.

In FIG. 4, by giving the memory circuits PTN1 and PTN2 different code pattern data, it is possible to obtain two sorts of m sequence codes in the shift register circuits MSRG1 and MSRG2 as well as MSRG3. Further, since same code pattern data are given to the shift register circuits MSRG2 and MSRG3, a same sort of am sequence codes are obtained there. However, concerning the initial stage, since the $n-1$ bits at the terminals B2 to Bn are common to the two shift register circuits and the remaining one bit at the terminal B1 is fixed at the "H" level for the MSRG2 and at the "L" level for the MSRG3, codes having different phases are produced. Consequently the GOLD codes generated at the gates E1 and E2 are always different. Further, since all the initial states of the shift register circuit MSRG1 are fixed at the "H" level, in the case where the initial state of $n-1$ bits at the terminals B2 to Bn of the shift register circuits MSRG2 and MSRG3 are changed, it is possible to obtain a pair of GOLD codes having patterns, which are not overlapped but are different from each other.

Although there are $2^{n-1}$ sorts of data, i.e. from 0 to $2^{n-1}-1$ (decimal), which can be inputted from data lines of $n-1$ bits, DAT1 to n-1, since for 0 (decimal) all the initial states of the shift register circuit MSRG3 are set at the "L" level, no m sequence code output can be obtained from the shift register circuit MSRG3. Consequently there are $2^{n-1}-1$ sorts of code data, which can be used for the CSK in reality. It is possible for the user to eliminate the necessity of control by means of a microcomputer or complicated driver circuits by assigning the code data from 1 to $2^{n-1}-1$ (decimal) to the channel number, as they are.

Although a code generator having the modular type shift register structure has been taken as an example in the above, it is true also in the case of the simple typ shift register structure that different kinds of GOLD codes can be obtained by varying the initial state and thus it is a matter of course that the present invention can be applied to a code generator having the simple type shift register structure.

As explained above, according to the second embodiment of the present invention, it is possible to obtain a code generator for the CSK, in which the code data can be assigned to the channel number, as they are.

Figure 5:
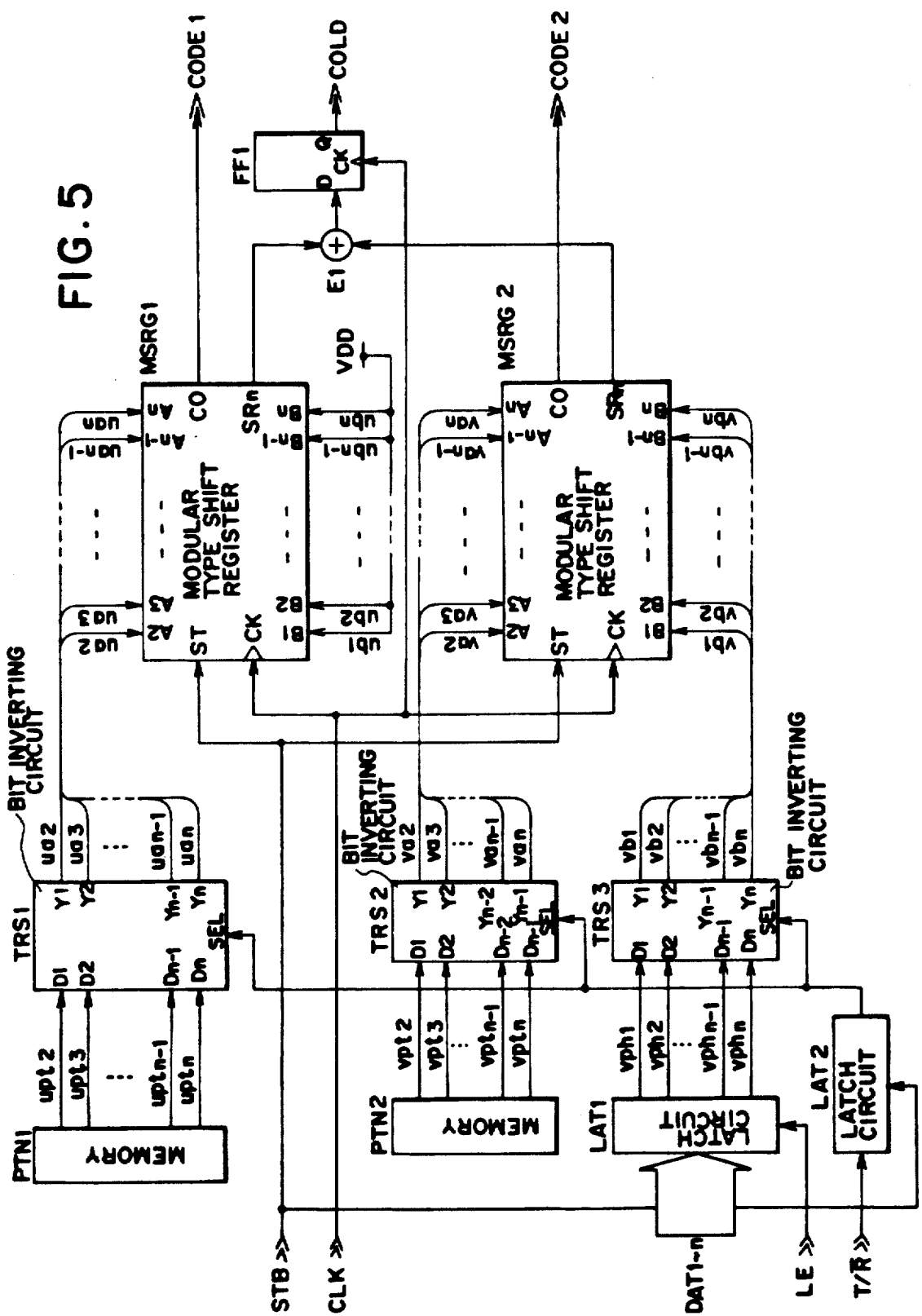

FIG. 5 shows the third embodiment of the code generator according to the present invention. In FIG. 5, MSRG1 and MSRG2 are modular type shift register circuits. A concrete example of the circuits is indicated in FIG. 3. The difference thereof from the modular type shift register portion indicated in FIG. 4 is that the number of stages is fixed at n. Further E1 is an exclusive logic sum gate for adding two m sequence codes mod.2. FF1 is a flipflop disposed for removing hazards. Since the input signal to the flipflop of the n-th stage is taken out through the terminal $SR_n$ of the modular type shift register circuits, at a terminal GOLD, a GOLD code having a phase completely identical to that of the m sequence codes outputted through terminals CODE1 and CODE2 is obtained. Further, in the figure, PTN1 and PTN2 are memory circuits, in which the code pattern data of the shift register circuits MSRG1 and MSRG2 are stored, and LAT1 is a latch circuit, which receives the code phase data of the shift register circuit MSRG2 from the exterior to hold them. TRS1, TRS2 and TRS3 are bit inverting circuits capable of generating two codes, which are in a mirror image relation to each other, starting from same code data. A concrete example of the circuits is indicated in FIG. 2.

The operation of the embodiment described above will be explained.

It is known that $2^{n-1}$ GOLD codes can be obtained, starting from two m sequence codes having a period of $2^{n-1}$, by varying the phase difference therebetween (R. C. Dixon, Spread Spectrum Systems, pp. 53-92, John Wiley & Sons (1984)). Consequently, according to the system of the present invention, the number of stages and the code pattern data of the two shift register circuits are fixed and only the code phase data are set from the exterior. In FIG. 5, since all the initial states of the shift register circuit MSRG1 are fixed at the "H" level, the phase difference between two m sequence codes can be varied by varying the initial state of the shift register circuit MSRG2. The states, which the modular type shift register having a structure consisting of n stages can take, are all the binary values of n bits except for the initial state, in which all the bits are 0. That is, it can be understood that, in the code data given from the exterior there are $2^{n-1}$ sorts from 1 to $2^{n-1}$ (decimal) and that different GOLD code outputs are obtained for different sorts. The user can set the code only by specifying the channel number, without knowing the structure of the code generator as in the prior art system, by assigning the code data from 1 to $2^{n-1}$ (decimal) corresponding to the initial states of the shift register circuit MSRG2 to the channel number.

Figure 10:
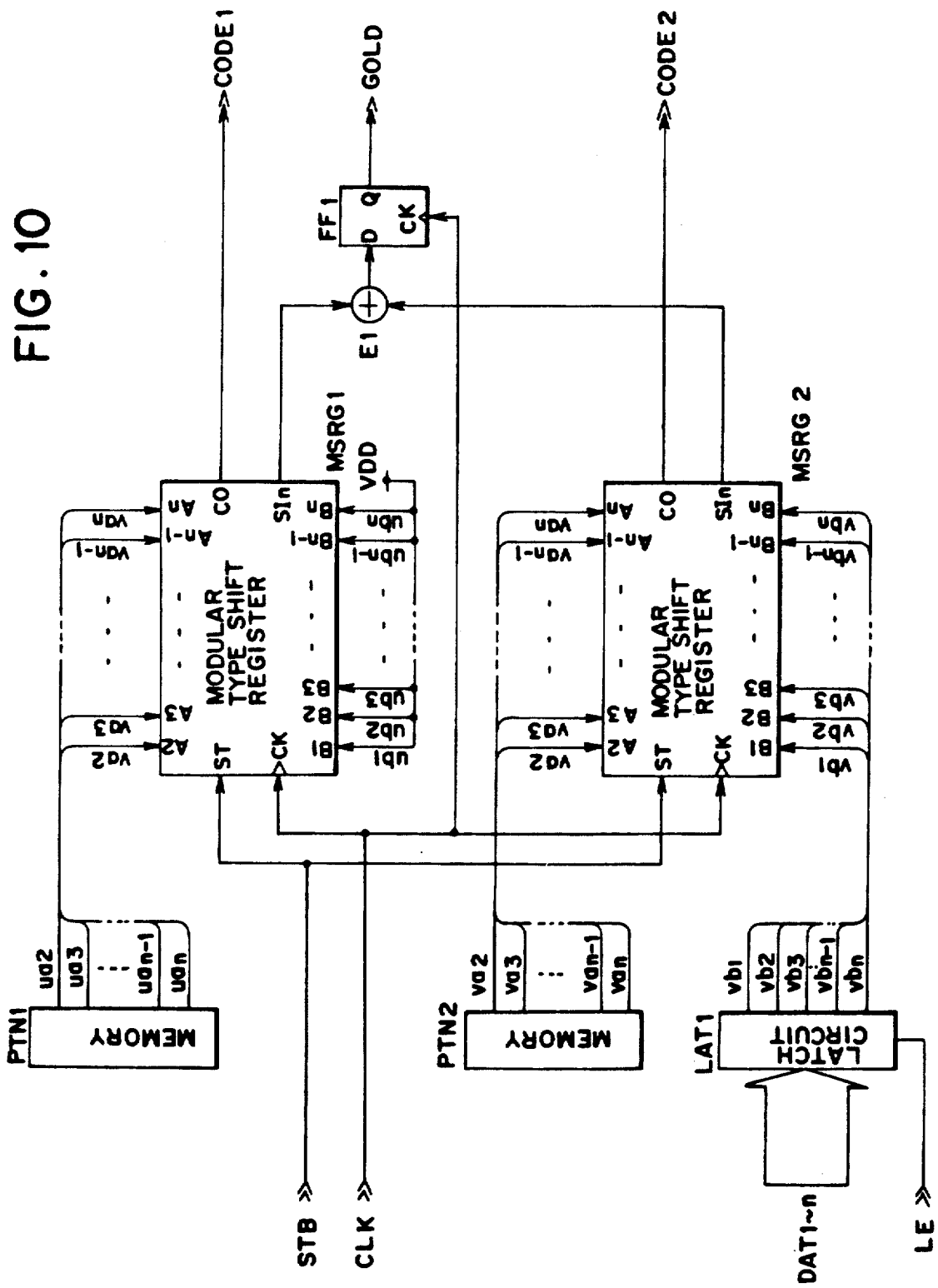
FIG. 10 is a scheme showing the construction of a GOLD code generator.

Further, in the circuit indicated in FIG. 10, since it comprises bit inverting circuits, also in the SSC using mirror image codes in the transmission and reception such as the convolver system, communication can be simply effected by specifying a same channel number both for the transmission and for the reception and switching over the transmission and the reception by a T/$\overline{\text{R}}$ signal. Further it is possible to increase the number of channels by using RAM, EPROM or latch circuits for the memory circuits PTN1 and PTN2 in FIG. 10 so that the code pattern data can be rewritten.

Although a code generator having the modular type shift register structure has been taken as an example, it is a matter of course that the present invention can be applied also to a code generator having simple type shift register structure.

As explained above, according to the third embodiment of the present invention no only the selection of the channel, i.e. the method for setting the code, is simplified, but also another advantage is obtained that it is possible to use the channel number as code data, as it is.

While particular embodiments of the invention have been shown and described, it will be obvious to those skilled in the art that various changes and modifications may be made without departing from the present invention in its broader aspect.

What is claimed is:

1. A pseudo random noise code generator comprising:
    bit inverting means having an input to which is applied code data necessary for setting a predetermined code and having an output to which said bit inverting means selectively supplies one of said code data and mirror image code data for setting a mirror image code of said predetermined code; and
    a shift register which is coupled to said output of said bit inverting means and which outputs a pseudo random noise code which is respectively said predetermined code and said mirror image of said predetermined code when said bit inverting means is respectively outputting said code data and said mirror image code data;
    wherein said bit inverting means includes output selecting means which, when code data necessary for setting a code u is applied to said input of said bit inverting means, outputs the code data necessary for setting the code u when a control signal has a first state and inverts the bits of said code data and outputs mirror image code data for setting the mirror image code $\overline{\text{u}}$ of said code u when said control signal has a second state, so that it is possible to select to output one of the two codes which are mirror images of each other from common code data in response to said control signal.

2. A pseudo random noise code generator, comprising:
    a first shift register, in which first code pattern data are inputted and whose initial state is fixed;
    a second shift register, in which second code pattern data, which are different from said first code pattern data, are inputted and the initial state of a predetermined stage thereof is fixed, while the other stages thereof are constructed so as to be variable;
    a third shift register, in which said second code pattern data are inputted and at the same time the initial state of a predetermined stage thereof is fixed, while the other stages thereof are constructed so as to be variable, said third shift register generating a code having a same pattern but a different phase with respect to said second shift register;
    first adding means for adding the outputs of said first and said second shift registers to each other modulo 2 and second adding means for adding the outputs of said first and said third shift registers to each other modulo 2, so as to generate different GOLD copies;
    selecting means for selecting one of the outputs of said first and said second adding means in response to a CSKI signal; and
    a third flipflop generating a GCSK code in response to the output selected by said selecting means.

3. A pseudo random noise code generator, comprising:
    first code generating means for generating a first code in the form of a plurality of parallel bits;
    second code generating means for generating as second ond code in the form of a plurality of parallel bits;
    first bit inverting means responsive to said first code and responsive to a control signal respectively having first and second states for respectively outputting said first code without change and outputting said first code in a bit-inverted form in which each least significant bit and a respective corresponding most significant bit thereof have changed places with each other;
    second bit inverting means responsive to said second code and responsive to said control signal respectively having said first and second states for respectively outputting said second code without change and outputting said second code in a bit-inverted form in which each least significant bit and a respective corresponding most significant bit thereof have changed placed with each other; and
    multiple-stage shift register circuit having a code data input port to which is applied the output from said first bit inverting means and a code phase data input port to which is applied the output from said second bit inverting circuit.

4. The generator according to claim 3, wherein said first and second code generating means are first and second latch circuits which are loaded with data in a time sharing sequence and which respectively output said first and second codes.

5. A pseudo random noise generator, comprising:
    first code generating means for generating a first code in the form of a plurality of parallel bits;
    second code generating means responsive to an external data signal for generating a second code in the form of a plurality of parallel bits;
    third code generating means for generating a third code in the form of a plurality of parallel bits;
    a multiple-stage first shift register having a code data input port coupled to said first code generating means and having a code phase data input port coupled to said second code generating means;
    a multiple-stage second shift register having a code data input port coupled to said third code generating means and having a code phase data input port to which is applied a predetermined code; and an exclusive logic sum gate which has two inputs respectively coupled to and which effects modulo 2 addition of respective outputs of said first shift register and said second shift register.

6. The generator according to claim 5, including a flip flop which has a data output, which has a data input coupled to an output of said exclusive logic sum gate, and which issues at said data output thereof a GOLD code.

7. The generator according to claim 5, including a first bit inverting circuit interposed between said first code generating means and said code data input port of said first shift register, a second bit inverting circuit interposed between said second code generating means and said code phase data input port of said first shift register, and a third bit inverting circuit interposed between said third code generating means and said code data input port of said second shift register, said first, second and third bit inverting circuits each being responsive to a control signal having respective first and second states for respectively issuing said first, second, and third codes without change when said control signal has said first state and for respectively issuing said first, second and third codes in a bit-inverted form in which each least significant bit and a respective corresponding most significant bit of each code have changed places with each other.

8. The generator according to claim 5, wherein said first code generating means and said third code generating means each include a memory storing data on code patterns.

9. A pseudo random noise code generator, comprising:

first code generating means for generating a first code in the form of a plurality of parallel bits;

second code generating means responsive to an external data signal for generating a second code in the form of a plurality of parallel bits;

third code generating means for generating a third code in the form of a plurality of parallel bits;

first, second and third multiple-stage shift registers, said first shift register and said third shift register each having a code data input port coupled to said first code generating means and having a code phase data input port coupled to said second code generating means, and said second shift register having a code data input port coupled to said third code generating means and having a code phase data input port to which is applied a predetermined code;

a first exclusive logic sum gate which has two inputs respectively coupled to and which effects modulo 2 addition of respective outputs from said first shift register and said second shift register; and a second exclusive logic sum gate which has two inputs respectively coupled to and which effects modulo 2 addition of respective outputs from said second shift register and said third shift register.

10. The generator according to claim 9, including first and second flip flops which each have a data output, which each have a data input coupled to an output from a respective one of said first and second exclusive logic sum gates, and which each issue at said data output thereof a respective one of first and second GOLD codes.

11. The generator according to claim 9, wherein said first and third code generating means each include a memory storing data on code patterns.

* * * * *

UNITED STATES PATENT AND TRADEMARK OFFICE
CERTIFICATE OF CORRECTION

PATENT NO. : 5 111 416
DATED : May 5, 1992
INVENTOR(S) : Masaaki HARADA

It is certified that error appears in the above-identified patent and that said Letters Patent is hereby corrected as shown below:

Column 10, line 14; replace "GOLD copies" with
---GOLD codes---.
      lines 24 and 25; replace "as second" with
---a second---.
      line 43; before "multiple-stage" insert
---a---.
      line 47; replace "inverting circuit" with
---inverting ו ans---.
Column 11, line 29; after "each other" insert ---when said control signal has said second state---.

Signed and Sealed this

Nineteenth Day of October, 1993

Attest:

BRUCE LEHMAN

*Attesting Officer*      Commissioner of Patents and Trademarks